United States Patent
Kim et al.

(10) Patent No.: US 7,668,032 B2
(45) Date of Patent: Feb. 23, 2010

(54) REFRESH OPERATION OF MEMORY DEVICE

(75) Inventors: Ki-Ho Kim, Kyoungki-do (KR); Seok-Cheol Yoon, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 112 days.

(21) Appl. No.: 11/819,808

(22) Filed: Jun. 29, 2007

(65) Prior Publication Data

US 2008/0062798 A1 Mar. 13, 2008

(30) Foreign Application Priority Data

Sep. 8, 2006 (KR) .................... 10-2006-0086759

(51) Int. Cl.
G11C 7/00 (2006.01)
G11C 7/10 (2006.01)

(52) U.S. Cl. .................. 365/222; 365/189.08; 365/191; 365/194; 365/196

(58) Field of Classification Search ............ 365/189.08, 365/191, 222
See application file for complete search history.

(56) References Cited

U.S. PATENT DOCUMENTS

| | | | |
|---|---|---|---|
| 5,446,695 A * | 8/1995 | Douse et al. ................. | 365/222 |
| 6,865,132 B2 | 3/2005 | Schaefer et al. | |
| 6,961,278 B2 | 11/2005 | Jeong | |
| 6,990,032 B2 | 1/2006 | Jang | |
| 2002/0000581 A1 | 1/2002 | Yamasaki | |
| 2002/0085441 A1 * | 7/2002 | Nam .......................... | 365/222 |
| 2002/0176287 A1 * | 11/2002 | Hur et al. ..................... | 365/200 |
| 2004/0240299 A1 * | 12/2004 | Fujimoto et al. ............. | 365/222 |
| 2005/0157585 A1 * | 7/2005 | Kato et al. .................... | 365/233 |
| 2005/0195674 A1 * | 9/2005 | Jang .............................. | 365/222 |
| 2005/0265103 A1 | 12/2005 | Remaklus, Jr. et al. | |

FOREIGN PATENT DOCUMENTS

| | | |
|---|---|---|
| JP | 2005-216429 | 8/2005 |
| JP | 2006-4558 | 1/2006 |
| KR | 10-2000-0046808 | 7/2000 |
| KR | 1020040007125 A | 1/2004 |
| KR | 10-0701705 B1 | 3/2007 |
| KR | 10-2007-0036631 | 4/2007 |

OTHER PUBLICATIONS

Korean Office Action issued in corresponding Korean Patent Application No. KR 10-2006-0086759, dated on Jan. 22, 2008.
Korean Office Action, issued in corresponding Korean Patent Application No. 9-5-2007-053830002, dated on Oct. 5, 2007.

* cited by examiner

*Primary Examiner*—Ly D Pham
(74) *Attorney, Agent, or Firm*—IP & T Law Firm PLC (57) ABSTRACT

A memory device includes a refresh generator and a refresh command generation circuit. The refresh generator generates a refresh signal for a refresh operation enable. The refresh command generation circuit logically combines the refresh signal and a reset signal to produce a refresh command. The refresh command generation circuit produces the refresh command only when either the refresh signal or the reset signal is enabled.

20 Claims, 6 Drawing Sheets

REFRESH OPERATION OF MEMORY DEVICE

CROSS-REFERENCE TO RELATED APPLICATION

The present invention claims priority of Korean patent application number 10-2006-0086759, filed on Sep. 8, 2006, which is incorporated by reference in its entirety.

BACKGROUND OF THE INVENTION

The present invention relates to a memory device, and, more particularly, to a refresh technique for use in the memory device.

As well-known in the art, a memory device employs a capacitor as a unit element for data storage and a transistor for its access, wherein the capacitor refers to a cell. In the memory device, data is written by applying a high electric potential to the cell when data of '1' is stored therein, and by applying a low electric potential to the cell when data of '0' is stored therein. The capacitor constituting the cell is designed in a manner that an electric charge therein should be always maintained as long as there is no change of an electric potential of the connection terminals of the capacitor if it is ideal. In fact, however, the capacitor loses the electric charge stored therein in the form of a leakage current with the passage of time, which makes it impossible to identify whether the written data is '1' or '0'. Therefore, it is necessary to perform a series of processes that periodically senses data stored in each cell and again stores it therein in order to continuously maintain data. This series of processes is called a refresh operation.

Figure 1:
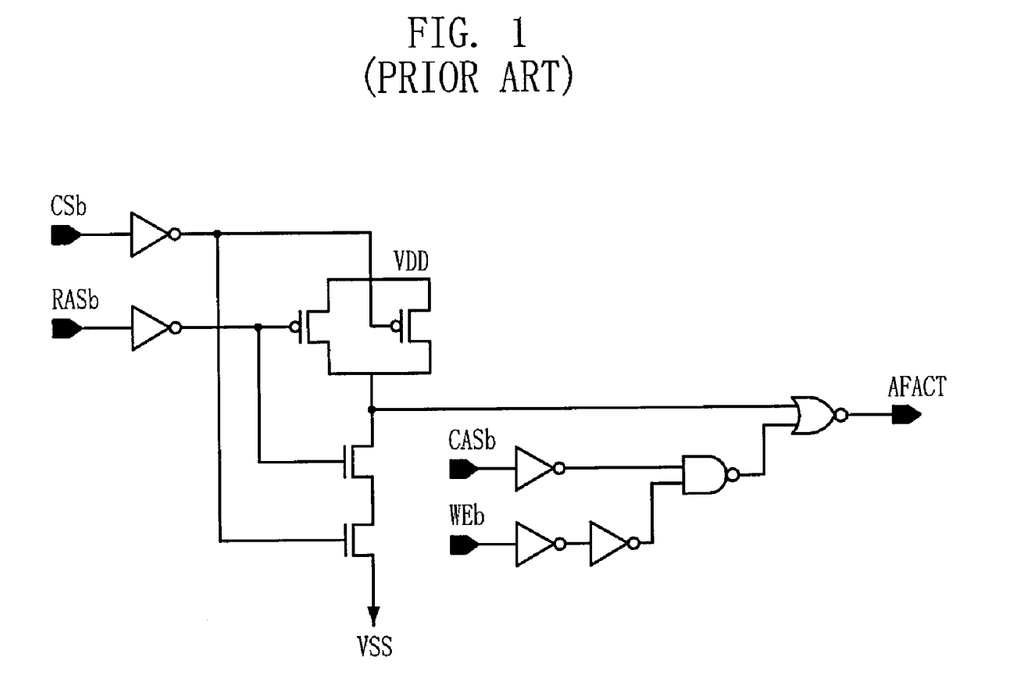
FIG. 1 is a diagram showing a structure of a conventional circuit which generates a refresh signal.

FIG. 1 is a diagram showing a structure of a conventional circuit which generates a refresh signal.

A refresh signal AFACT refers to a signal for generating a refresh command RE. As shown in the drawing, this signal is generated by logically combining a chip select signal CS, a row address strobe signal RAS, a column address strobe signal CAS, and a write enable signal WE. Specifically, when these signals are inputted from outside, they are in the form of inverted signals, in which the subscript 'b' is added to each input pad to indicate the state, as shown in the drawing.

The refresh signal AFACT is generated when the chip select signal CS is a logic high, the row address strobe signal RAS is a logic high, the column address strobe signal CAS is a logic high, and the write enable signal WE is a logic low. That is, the refresh signal AFACT of a logic high is generated to an output terminal when a logic low is applied to a CSb terminal, a logic low to a RASb terminal, a logic low to a CASb terminal, and a logic high to a WEb terminal.

Figure 2:
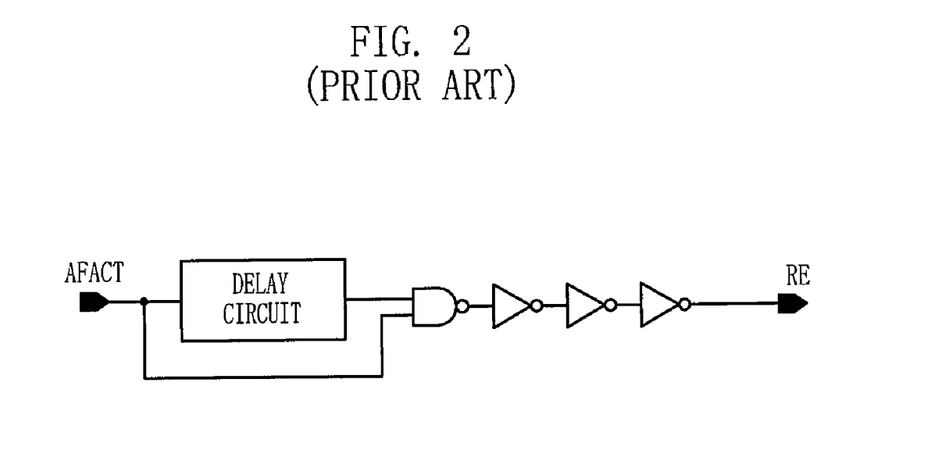
FIG. 2 is a diagram showing a structure of a conventional circuit which generates a refresh command.

FIG. 2 is a diagram showing a structure of a conventional circuit which generates a refresh command.

The circuit as shown in FIG. 2 serves to generate a refresh command RE by using the refresh signal AFACT. In other words, the refresh command RE is generated by adjusting the width of the signal by a NAND gate and a driver (inverter) by using the refresh signal AFACT and its delayed signal through a delay circuit.

Figure 3:
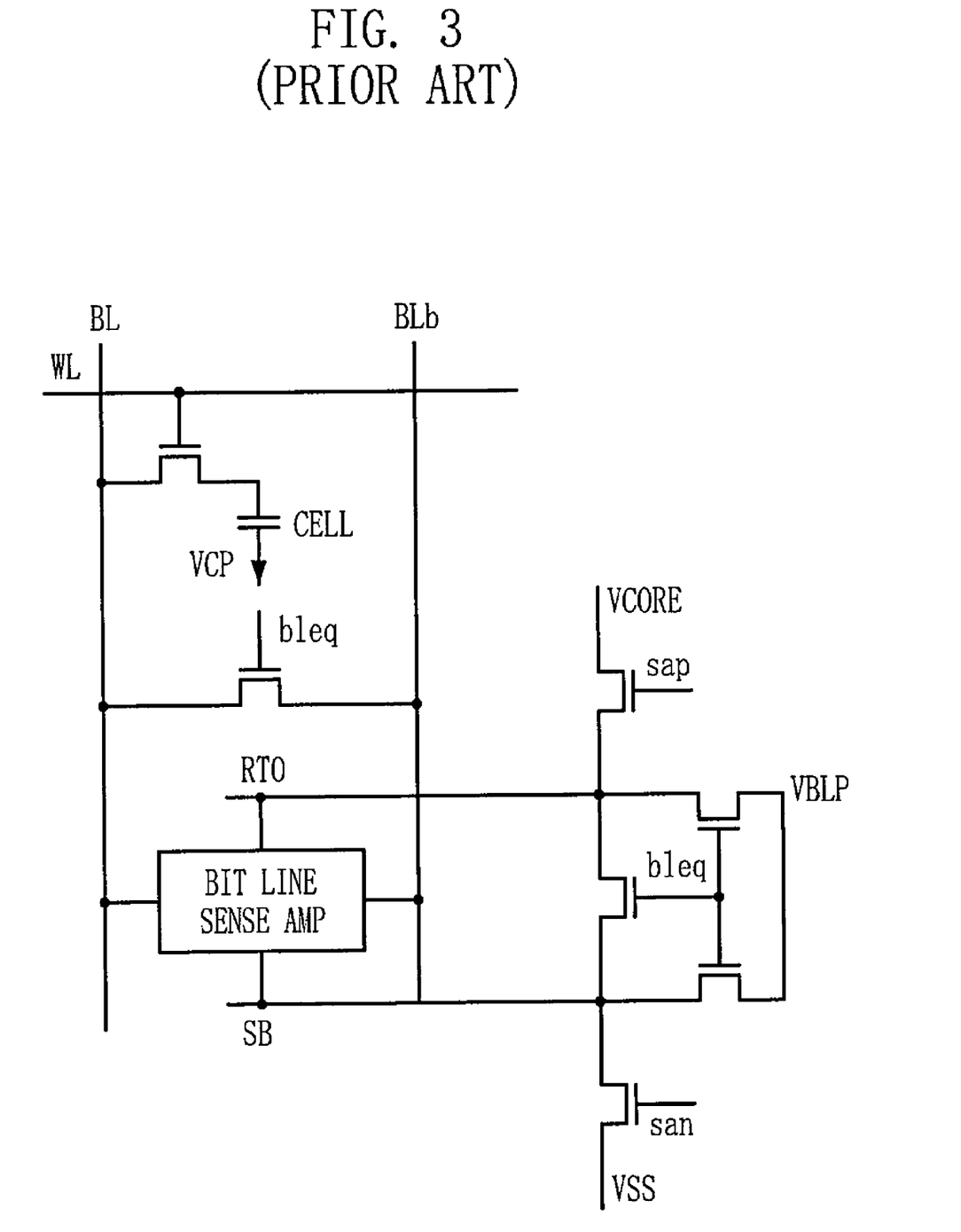
FIG. 3 is a diagram showing a structure of a bit line sense amp and its peripheral circuits.
Figure 4:
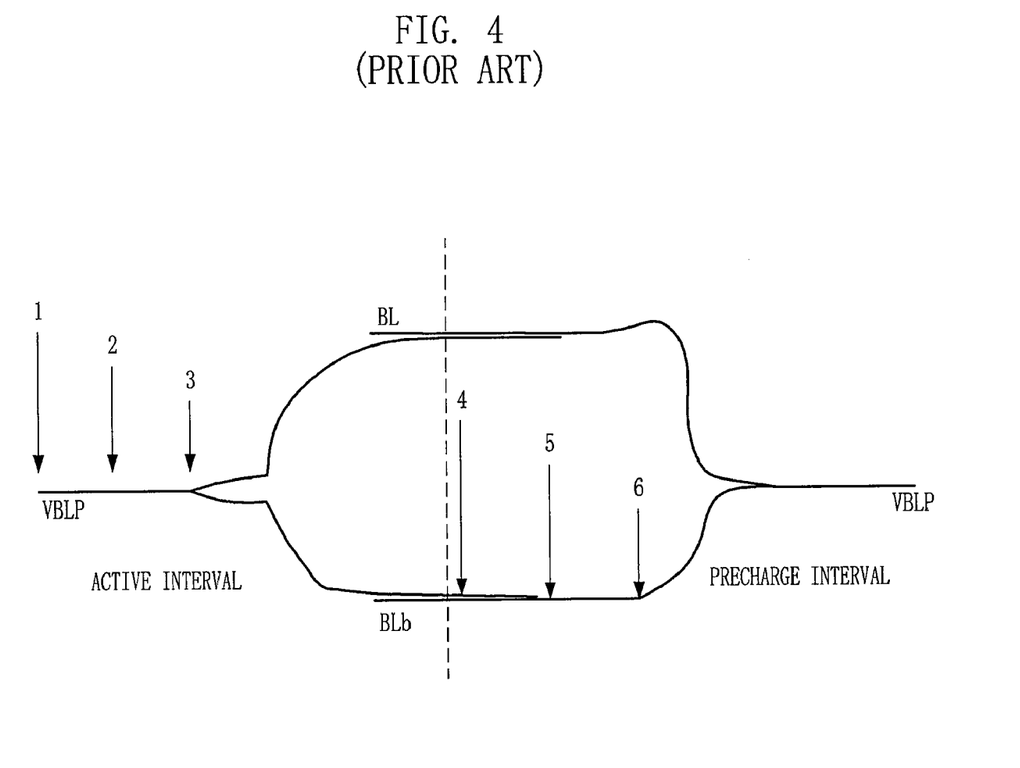
FIG. 4 is a diagram in which a refresh operation is divided into an active interval and a precharge interval that are arranged in the sequence of time.

FIGS. 3 and 4 are diagrams for explaining a refresh operation, wherein FIG. 3 is a diagram showing the structure of a bit line sense amp and its peripheral circuits and FIG. 4 is a diagram in which the refresh operation period is divided into an active interval and a precharge interval that are arranged in the sequence of time.

Referring to FIG. 3, a word line WL is enabled in response to an active command and cell data is carried on a positive bit line BL. At this time, the positive bit line BL and a negative bit line BLb have a potential difference of dV. When the bit line sense amp senses this difference, it makes the positive bit line BL have a core voltage VCORE and the negative bit line BLb have a ground voltage VSS. Following the active operation, the precharge operation allows the word line WL to be disabled, the cell voltage to be isolated, and the voltage levels of the positive bit line BL and the negative bit line BLb to be a bit line precharge voltage VBLP.

Referring to FIG. 4 in the order of time, after the bit lines BL and BLb pair has been equalized to the bit line precharge voltage VBLP, first, the bit line equalizing operation becomes deactivated (i.e., a bleq signal of FIG. 3 is a logic low). Second, the word line WL becomes activated and the cell data is carried on the bit line BL, and third, the sense amp driver becomes on and the bit line sense amp starts the sensing operation. After this active operation has been completed, if the operation goes to the precharge interval, fourth the word line WL becomes deactivated. Fifth, the sense amp driver becomes off and the operation of the bit line sense amp is stopped, and finally, the positive bit line BL and the negative bit line BLb are equalized to the level of the bit line precharge voltage VBLP.

The conventional memory device stabilizes the bit line precharge voltage VBLP and a cell plate voltage VCP to ½ of the core voltage VCORE by using the refresh command during an initialization process in which the memory device normally operates after its power-up.

Figure 5:
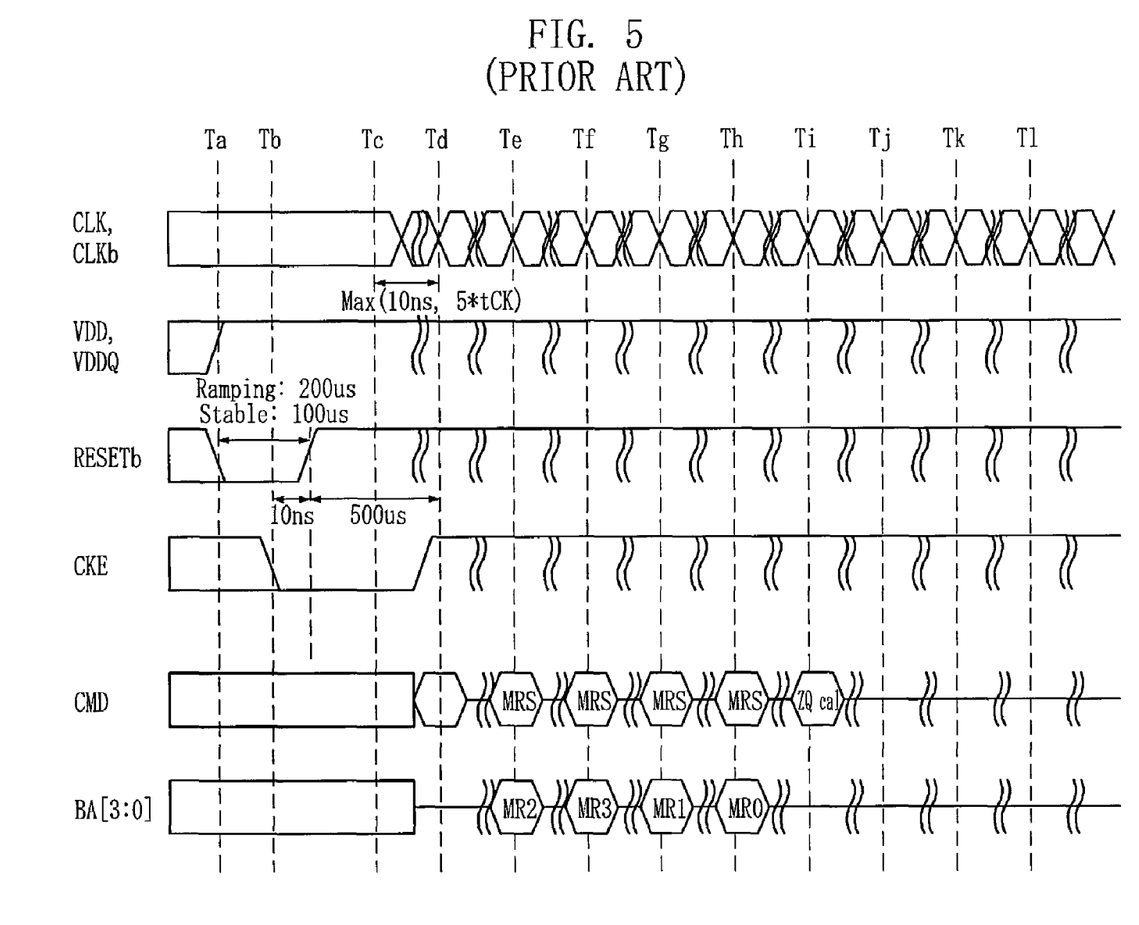
FIG. 5 is a timing chart showing an initialization process of a DDR3 memory device.

FIG. 5 is a timing chart showing an initialization process of a DDR3 (double data rate3) memory device.

As shown in FIG. 5, in case of the DDR3 memory device, there exists no separate refresh command in the initialization process, and after its reset, a clock enable signal CKE (which is a signal for synchronizing the memory device with a clock) becomes a logic high level and thereafter a MRS (mode register set) command is performed. As such, if there is no separate refresh command in the initialization process, the bit line precharge voltage VBLP and the cell plate voltage VCP may have a certain level other than ½ level of the core voltage VCORE after the initialization process.

Figure 6:
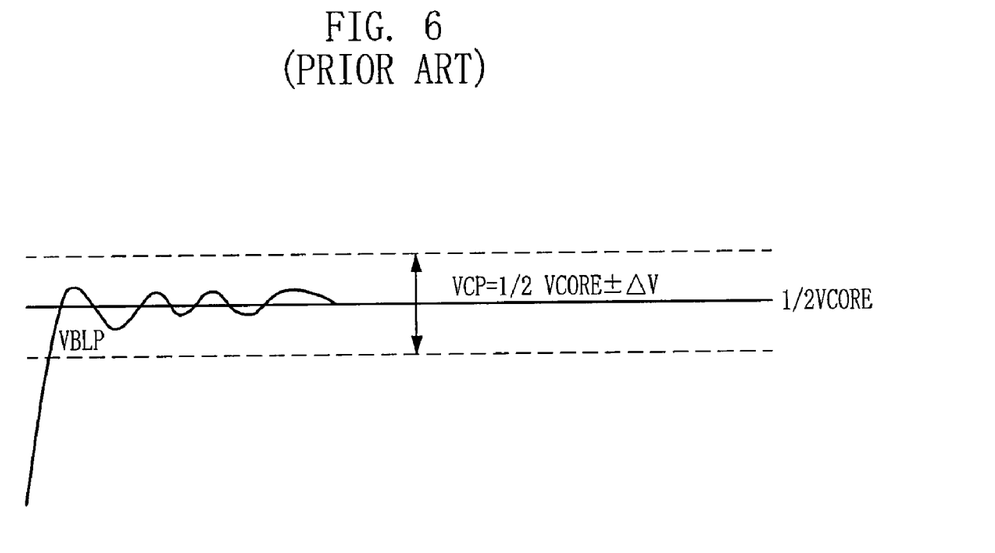
FIG. 6 shows levels of the bit line precharge voltage and the cell plate voltage when the refresh operation is not performed.

FIG. 6 shows levels of the bit line precharge voltage and the cell plate voltage when the refresh operation is not performed.

As shown in the drawing, if there is no separate refresh command in the initialization process, the level of the bit line precharge voltage VBLP may not reach ½ of the core voltage VCORE. And the cell plate voltage VCP may have a level of ½ core voltage VCORE±dV. If the bit line precharge voltage VBLP and the cell plate voltage VCP are unstable, a failure may occur during the operation of the memory device after the initialization.

SUMMARY OF THE INVENTION

Embodiments of the present invention relate to providing a refresh command generator for generating a refresh command by using a reset signal provided from outside of a chip during an initialization operation, even in case where there is no refresh command during the initialization operation.

In accordance with an aspect of the present invention, there is provided a memory device including a refresh generator for generating a refresh signal for an enablement of a refresh operation; and a refresh command generation circuit for logically combining the refresh signal and a reset signal to produce a refresh command.

In accordance with another aspect of the present invention, there is provided a method for generating a refresh command in a memory device, including: producing a refresh signal for an enablement of a refresh operation; receiving a reset signal that is generated during an initialization operation of the memory device; and logically combining the refresh signal and the reset signal to generate a refresh command.

DESCRIPTION OF SPECIFIC EMBODIMENTS

Hereinafter, a preferred embodiment of the present invention will be set forth in detail with reference to the accompanying drawings so that a person skilled in the art can easily carry out the invention.

Figure 7:
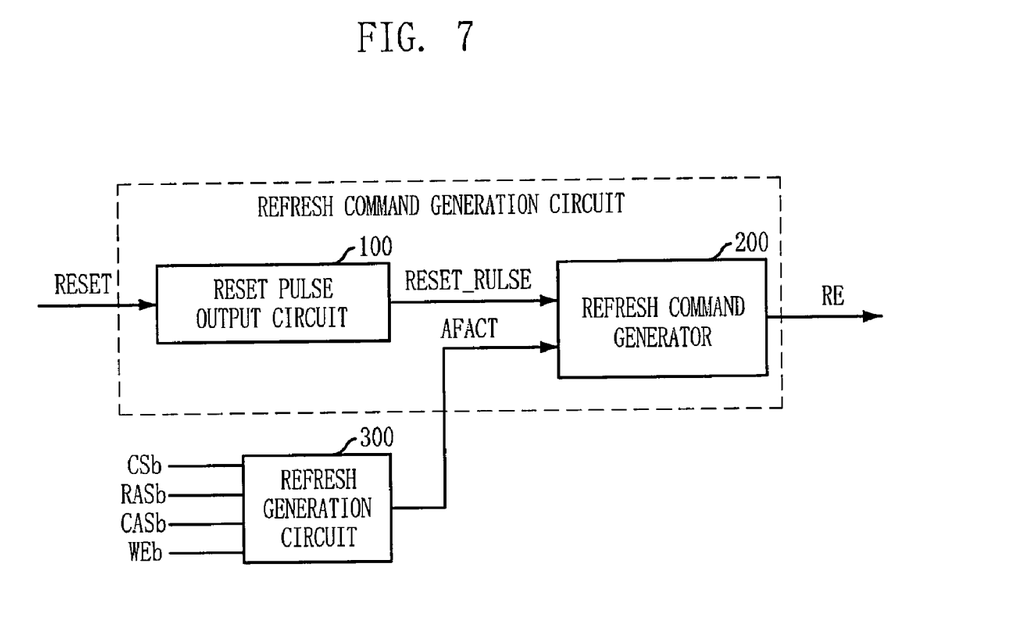
FIG. 7 is a block diagram of a memory device having a refresh command generation circuit in accordance with a preferred embodiment of the present invention.

FIG. 7 is a block diagram of a memory device having a refresh command generation circuit in accordance with a preferred embodiment of the present invention.

As shown in the drawing, the memory device of the present invention includes a refresh generation circuit 300 and a refresh command generation circuit. The refresh command generation circuit receives a refresh signal AFACT generated by the refresh generator 300 and a reset signal RESET generated upon initialization of the memory device, and outputs a refresh command RE when at least one of them is enabled.

The refresh command generation circuit, as shown in the drawing, is provided with a reset pulse output circuit 100 and a refresh command generator 200. The reset pulse output circuit 100 serves to accept the reset signal RESET and produce a reset pulse RESET_PULSE with a certain width. The refresh command generator 200 receives the refresh signal AFACT and the reset pulse RESET_PULSE and outputs the refresh command RE when at least one of them is enabled.

The refresh generation circuit 300 may be configured by the same circuit as the refresh signal generation circuit shown in FIG. 1, and logically combines a chip select signal CS, a row address strobe signal RAS, a column address strobe signal CAS and a write enable signal WE to generate the refresh signal AFACT.

Figure 8:
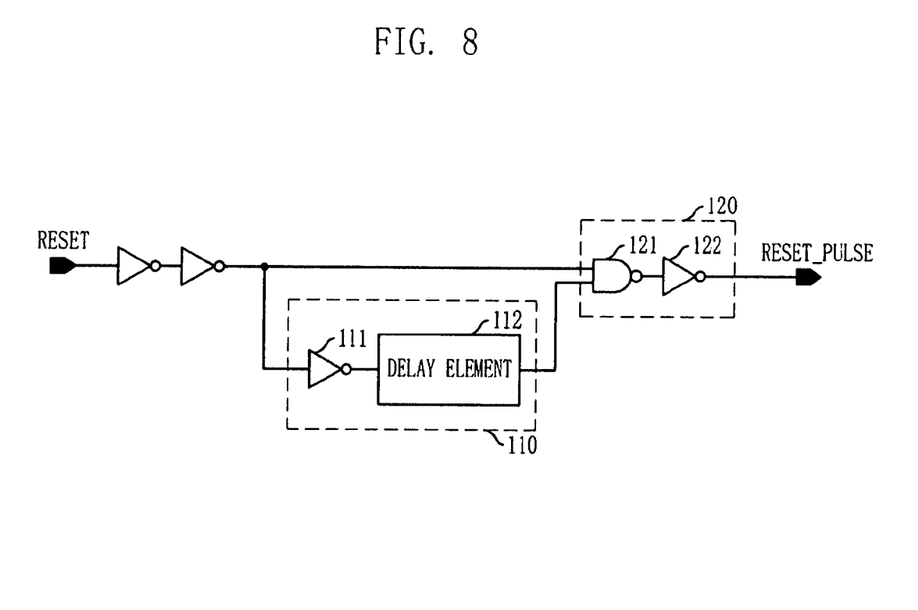
FIG. 8 is a detailed circuit diagram of one example of the reset pulse output circuit depicted in FIG. 7.

FIG. 8 illustrates a detailed circuit diagram of one example of the reset pulse output circuit 100 depicted in FIG. 7.

The reset pulse output circuit 100 is provided with a delay circuit 110 for delaying the reset signal RESET and an output circuit 120 for logically combining an output of the delay circuit 110 and the reset signal RESET to provide a combined signal.

The delay circuit 110 can be constituted by a multiplicity of inverters for inverting and delaying the reset signal RESET. Included in the delay circuit 110 are an inverter 111 that functions to invert the reset signal RESET, and a delay element 112 embodied by an even number of inverters coupled in series.

The output circuit 120 logically combines an output of the delay circuit 110 and the reset signal RESET to output the reset pulse RESET_PULSE, and can be implemented by a NAND gate 121 that logically combines the reset signal RESET and the output of the delay circuit 110 and an inverter 122 for inverting an output of the NAND gate 121.

In operation, the reset pulse output circuit 100 takes the reset signal RESET, and inverts and delays it through the delay circuit 110. The output circuit 120 logically combines the reset signal RESET and an output of the delay circuit 110 by using the NAND gate 121 and the inverter 122 to generate a high signal by a time interval during which both signals are all logic high. Thus, the reset pulse RESET_PULSE with a width corresponding to a delayed value of the delay circuit 110 is finally generated.

Figure 9:
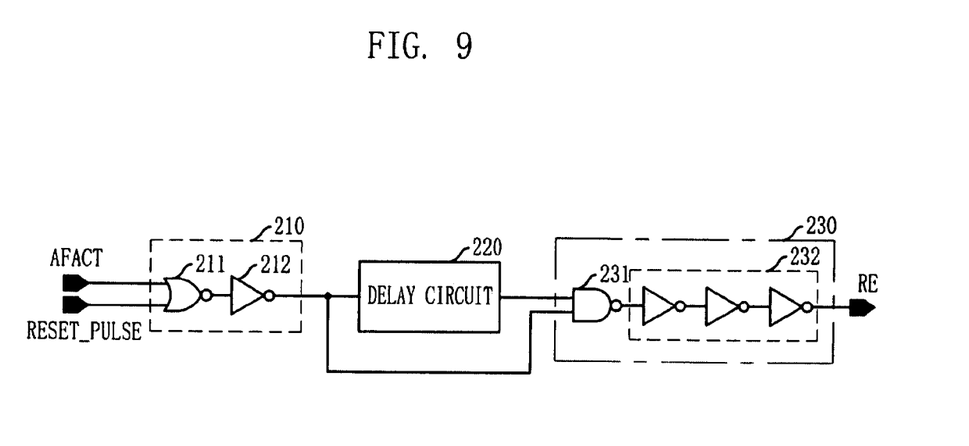
FIG. 9 is a detailed circuit diagram of one example of the refresh command generator depicted in FIG. 7.

FIG. 9 is a detailed circuit diagram of one example of the refresh command generator 200 depicted in FIG. 7.

The refresh command generator 200 is provided with an input circuit 210 for logically combining the refresh signal AFACT and the reset pulse RESET_PULSE, a delay circuit 220 for delaying an output of the input circuit 210, and an output circuit 230 for logically combining outputs of the input circuit 210 and the delay circuit 220. As mentioned above, the refresh signal AFACT is made by logically combining the chip select signal CS, the row address strobe signal RAS, the column address strobe signal CAS and the write enable signal WE.

To be more specific, the input circuit 210 can be constituted by a NOR gate 211 which receives the refresh signal AFACT and the reset pulse RESET_PULSE, and an inverter 212 for inverting an output of the NOR gate 211.

The delay circuit 220 can be embodied by a multiplicity of inverters for delaying an output of the input circuit 210.

The output circuit 230 can be configured by a NAND gate 231 taking an output of the input circuit 210 and an output of the delay circuit 220 and an odd number of inverters 232 for inverting an output of the NAND gate 231.

In operation, the input circuit 210 logically combines the refresh signal AFACT and the reset pulse RESET_PULSE through the NOR gate 211 and the inverter 212 to output a high value when at least one of them is a logic high. Therefore, the present invention can generate the refresh command although there is the reception of the reset command during the initialization operation of the memory device. The delay circuit 220 delays the output of the input circuit 210. The output circuit 230 logically combines the output of the input circuit 210 and the output of the delay circuit 220 by using the NAND gate 221 and the odd number of inverter 232, to generate the refresh command RE having a high pulse with a time interval during which they are all logic high.

The reason for delaying the output of the input circuit 210 through the delay circuit 220 is to adjust the pulse width of the refresh command RE in harmonization with a given specification. For example, if the pulse width of the refresh command RE defined in the specification is 3 ns, the delay value of the delay circuit 110 is set to 5 ns, to produce the reset pulse RESET_PULSE with a width of 5 ns. And, if the delay value of the delay circuit 220 of the refresh command generator 200 is set to 2 ns, it is possible to output the refresh command RE with a width of 3 ns by delaying the pulse with a width of 5 ns and performing an AND operation of the delayed pulse and the original pulse with a width of 5 ns.

In accordance with the present invention, the process of generating a refresh command RE of the memory device includes the steps of generating a refresh signal AFACT for enabling a refresh operation; taking a reset signal RESET generated upon initialization of the memory device; and logically combining the refresh signal AFACT and the reset signal RESET to produce the refresh command RE.

More specifically, the step of generating the refresh command RE includes the steps of generating a reset pulse RESET_PULSE by using the reset signal RESET; and outputting the refresh command RE when at least one of the refresh signal AFACT and the reset pulse RESET_PULSE is a logic high.

Further, the step of generating the reset pulse RESET_PULSE can be embodied by inverting and delaying the reset signal RESET and outputting the reset pulse RESET_PULSE with a time interval during which the delayed signal and the reset signal RESET are all logic high.

In addition, the step of outputting the refresh command RE can be achieved by including the steps of logically combining the refresh signal AFACT and the reset pulse RESET_PULSE by using a NOR gate; delaying the combined signal; and logically combining the combined signal and the delayed signal by using a NAND gate.

As described above, the present invention generates a refresh command by using a reset signal provided from outside of a chip during an initialization operation, even in case there is no refresh command during the initialization operation, like a DDR3 memory device. Thus, the refresh operation is performed during the initialization operation of the memory device, so that a bit line precharge voltage VBLP and a cell plate voltage VCP can be stabilized. In conclusion, it is possible to prevent a failure which may occur when the memory device operates after the initialization operation.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
   a refresh generator for generating a refresh signal for an enablement of a refresh operation; and
   a refresh command generation circuit for logically combining the refresh signal and a reset signal to enable a refresh command,
   wherein the refresh command generation circuit includes:
      a reset pulse output circuit for generating a reset pulse based on the reset signal; and
      a refresh command generator for producing the refresh command when at least one of the refresh signal and the reset pulse is enabled.

2. The memory device as recited in claim 1, wherein the refresh command generation circuit produces the refresh command only when either the refresh signal or the reset signal is enabled.

3. The memory device as recited in claim 1, wherein the reset pulse output circuit includes:
   a delay circuit for delaying the reset signal; and
   an output circuit for logically combining an output of the delay circuit and the reset signal to output a combined signal.

4. The memory device as recited in claim 3, wherein the delay circuit is provided with a multiplicity of inverters which inverts and delays the reset signal.

5. The memory device as recited in claim 4, wherein the output circuit is provided with a NAND gate for logically combining the reset signal and an output of the delay circuit and an inverter for inverting an output of the NAND gate.

6. The memory device as recited in claim 1, wherein the refresh command generator includes:
   an input circuit for logically combining the refresh signal and the reset pulse;
   a delay circuit for delaying an output of the input circuit; and
   an output circuit for logically combining outputs of the input circuit and the delay circuit.

7. The memory device as recited in claim 6, wherein the input circuit includes:
   a NOR gate receiving the refresh signal and the reset pulse; and
   an inverter for inverting an output of the NOR gate.

8. The memory device as recited in claim 6, wherein the delay circuit is provided with a multiplicity of inverters which delays an output of the input circuit.

9. The memory device as recited in claim 6, wherein the output circuit includes:
   a NAND gate for receiving an output of the input circuit and an output of the delay circuit; and
   an odd number of inverters for inverting an output of the NAND gate.

10. The memory device as recited in claim 1, wherein the refresh generator logically combines a chip select signal, a row address strobe signal, a column address strobe signal, and a write enable signal, to generate the refresh signal.

11. A method for generating a refresh command in a memory device, comprising:
   producing a refresh signal for an enablement of a refresh operation;
   receiving a reset signal generated during an initialization operation of the memory device; and
   logically combining the refresh signal and the reset signal to enable a refresh command,
   wherein the logically combining the refresh signal and the reset signal includes:
      generating a reset pulse by using the reset signal; and
      producing the refresh command when at least one of the refresh signal and the reset pulse is enabled,
   wherein the reset pulse is activated when both a signal generated by inverting and delaying the reset signal and the reset signal have a logic high level.

12. The method as recited in claim 11, wherein the refresh signal is produced by logically combining a chip select signal, a row address strobe signal, a column address strobe signal, and a write enable signal, to generate the refresh signal.

13. The method as recited in claim 11, wherein producing the refresh command includes:
   logically combining the refresh signal and the reset pulse by using a NOR gate to thereby generate a first signal;
   delaying the first signal to thereby generate a second signal; and
   logically combining the first and the second signals by using a NAND gate.

14. A memory device, comprising:
   a refresh generator for generating a refresh signal for an enablement of a refresh operation; and
   a refresh command generation circuit for logically combining the refresh signal and a reset signal, to which are produced as a refresh command,
   wherein the refresh command generation circuit includes:
      a reset pulse output circuit for generating a reset pulse based on the reset signal; and
      a refresh command generator for producing the refresh command when at least one of the refresh signal and the reset pulse is enabled.

15. The memory device as recited in claim 14, wherein the reset pulse output circuit includes:
- a delay circuit for delaying the reset signal; and
- an output circuit for logically combining an output of the delay circuit and the reset signal to output a combined signal.

16. The memory device as recited in claim 14, wherein the refresh command generator includes:
- an input circuit for logically combining the refresh signal and the reset pulse;
- a delay circuit for delaying an output of the input circuit; and
- an output circuit for logically combining outputs of the input circuit and the delay circuit.

17. The memory device as recited in claim 14, wherein the refresh generator logically combines a chip select signal, a row address strobe signal, a column address strobe signal, and a write enable signal, to generate the refresh signal.

18. A method for generating a refresh command in a memory device, comprising:
- producing a refresh signal for an enablement of a refresh operation;
- receiving a reset signal generated during an initialization operation of the memory device to generate a reset pulse; and
- logically combining the refresh signal and the reset pulse to generate a refresh command,
- wherein the reset pulse is activated when both a signal generated by inverting and delaying the reset signal and the reset signal have a logic high level.

19. The method as recited in claim 18, wherein the refresh command is produced when at least one of the refresh signal and the reset pulse is enabled.

20. The method as recited in claim 19, wherein producing the refresh command includes:
- logically combining the refresh signal and the reset pulse by using a NOR gate to thereby generate a first signal;
- delaying the first signal to thereby generate a second signal; and
- logically combining the first and the second signals by using a NAND gate.

* * * * *